United States Patent
Wu et al.

(10) Patent No.: US 10,674,624 B2
(45) Date of Patent: Jun. 2, 2020

(54) ELECTRICAL CONNECTOR WITH CARRIER AND COVER

(71) Applicant: FOXCONN INTERCONNECT TECHNOLOGY LIMITED, Grand Cayman (KY)

(72) Inventors: Heng-Kang Wu, Kunshan (CN); Fu-Jin Peng, Kunshan (CN); Tzu-Li Chu, New Taipei (TW)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 11 days.

(21) Appl. No.: 16/102,641

(22) Filed: Aug. 13, 2018

(65) Prior Publication Data

US 2019/0053393 A1    Feb. 14, 2019

(30) Foreign Application Priority Data

Aug. 11, 2017   (CN) .......................... 2017 1 0685393

(51) Int. Cl.
| | |
|---|---|
| H05K 7/10 | (2006.01) |
| H01R 12/88 | (2011.01) |
| H01R 12/70 | (2011.01) |
| H01R 13/52 | (2006.01) |
| H05K 3/30 | (2006.01) |

(52) U.S. Cl.
CPC ....... H05K 7/1007 (2013.01); H01R 12/7076 (2013.01); H01R 12/88 (2013.01); H01R 13/5213 (2013.01); H05K 3/303 (2013.01)

(58) Field of Classification Search
CPC .. H05K 7/1007; H01R 12/88; H01R 12/7076; H01R 13/5213

USPC .......................................................... 439/331
See application file for complete search history.

(56) References Cited

U.S. PATENT DOCUMENTS

| | | | | |
|---|---|---|---|---|
| 5,127,837 A | * | 7/1992 | Shah ................... | G01R 1/0408 439/248 |
| 6,354,859 B1 | * | 3/2002 | Barabi ................ | G01R 1/0483 257/E23.078 |
| 6,666,703 B2 | * | 12/2003 | Takeuchi ............ | H01L 23/4093 257/E23.086 |
| 6,905,353 B2 | * | 6/2005 | Ma ...................... | H01R 13/5213 |
| 7,083,456 B2 | * | 8/2006 | Trout .................. | H01R 13/2442 439/326 |

(Continued)

FOREIGN PATENT DOCUMENTS

| | | |
|---|---|---|
| CN | 206401562 U | 8/2017 |
| TW | I276255 | 3/2007 |

*Primary Examiner* — Tulsidas C Patel
*Assistant Examiner* — Peter G Leigh
(74) *Attorney, Agent, or Firm* — Wei Te Chung; Ming Chieh Chang (57) ABSTRACT

An electrical connector includes an insulative housing and a plurality of contacts retained in the housing, a carrier associated with an electronic package therein to be loaded into the housing, a load plate pivotally mounted by one end of the housing for downwardly abutting against the electronic package for assuring mechanical and electrical connection between the electronic package and the contacts, and a dust cover detachably attached to the carrier during shipping while being removed from the carrier when the electronic package is loaded unto the housing and downwardly pressed by the load plate in a later time.

18 Claims, 8 Drawing Sheets

(56) References Cited

U.S. PATENT DOCUMENTS

| | | | | |
|---|---|---|---|---|
| 7,182,620 B1* | 2/2007 | Ju | ............... | H01R 12/88 |
| | | | | 439/331 |
| 7,632,115 B1* | 12/2009 | Polnyi | ............... | H05K 7/1053 |
| | | | | 439/135 |
| 7,708,571 B2* | 5/2010 | Terhune | ............... | H05K 7/1053 |
| | | | | 439/135 |
| 8,137,121 B2* | 3/2012 | Dai | ............... | H05K 7/1053 |
| | | | | 439/135 |
| 8,460,012 B2* | 6/2013 | Zhou | ............... | G01R 1/0466 |
| | | | | 439/331 |
| 8,905,794 B2* | 12/2014 | Chawla | ............... | H01R 12/724 |
| | | | | 439/487 |
| 8,979,566 B2* | 3/2015 | Yeh | ............... | H01R 13/62933 |
| | | | | 439/331 |
| 9,110,096 B2* | 8/2015 | Hsieh | ............... | G01R 1/0466 |
| 9,231,318 B2* | 1/2016 | Liu | ............... | H01L 23/32 |
| 9,270,035 B2* | 2/2016 | Yeh | ............... | H05K 7/10 |
| 9,270,050 B2* | 2/2016 | Liu | ............... | G06F 1/18 |
| 9,385,457 B2* | 7/2016 | Chawla | ............... | H01R 12/724 |
| 9,496,630 B2* | 11/2016 | Liu | ............... | H01L 23/32 |
| 2008/0045048 A1* | 2/2008 | Ma | ............... | H05K 7/1061 |
| | | | | 439/73 |
| 2009/0061652 A1* | 3/2009 | Fan | ............... | H01R 13/6595 |
| | | | | 439/41 |
| 2017/0110815 A1* | 4/2017 | Xiao | ............... | H05K 7/12 |

* cited by examiner

ELECTRICAL CONNECTOR WITH CARRIER AND COVER

BACKGROUND OF THE INVENTION

1. Field of the Invention

The invention relates to the electrical connector, particularly to the electrical connector equipped with a carrier for loading an electronic package thereinto and a dust cover detachably attached with a load plate which is adapted to downwardly press the electronic package with removal of the cover therefrom.

2. Description of Related Art

On one hand, U.S. patent Ser. No. 10/038,258 discloses an electrical connector for use with an electronic package, including an insulative housing (2), a plurality of contacts retained in the housing (2), a carrier or clip (1) for carrying the electronic package (200), and an outermost load plate or metallic pressing cover (6) downwardly pressing both the electronic package (200) and the carrier (1). On the other hand, the Taiwan Patent TWI276255 discloses an electrical connector equipped with an insulative protective/dust cover attached to the housing and having a transparent inspection area thereof. It is desired to have the former further equipped with a removable dust cover for dust-prevention consideration before the electronic package is loaded unto the housing. Notably, it may relative easy to applying a removable dust-cover upon an external side/face the outermost load plate (6) while such an engagement may be easily loosened by an external impact during shipping.

It is desired to have the electrical connector equipped with a dust cover which is reliably retained with the electrical connector during shipping while being convenient to be taken off from the electrical connector when the electronic package is loaded unto the housing.

SUMMARY OF THE INVENTION

An electrical connector includes an insulative housing and a plurality of contacts retained in the housing, a carrier associated with an electronic package therein to be loaded into the housing, a load plate pivotally mounted by one end of the housing for downwardly abutting against the electronic package for assuring mechanical and electrical connection between the electronic package and the contacts, and a dust cover detachably attached to the carrier during shipping while being removed from the carrier when the electronic package is loaded unto the housing and downwardly pressed by the load plate in a later time.

According to the invention, a method of mounting an electrical connector upon a printed circuit board and successively loading an electronic package into the electrical connector, comprising steps of: providing an insulative housing with a plurality of conductive contacts retained therein to be commonly mounting to a printed circuit board, and with a receiving cavity therein for receiving an electronic package so as to make connection between the electronic package and the printed circuit board; providing a carrier configured to be adapted to have the electronic package and a dust cover attached thereto and coupled to the housing; providing the dust cover initially associatively attached to the carrier, and providing a metallic load plate beside the housing to downwardly press the carrier and further optimally/optionally downwardly restrict the dust cover during shipping; loading the electronic package unto the housing by detaching the dust cover from the carrier; and downwardly pressing the load plate against the electronic package and further optimally/optionally the carrier.

Other objects, advantages and novel features of the invention will become more apparent from the following detailed description when taken in conjunction with the accompanying drawings.

DETAILED DESCRIPTION OF THE PREFERRED EMBODIMENT

Figure 1:
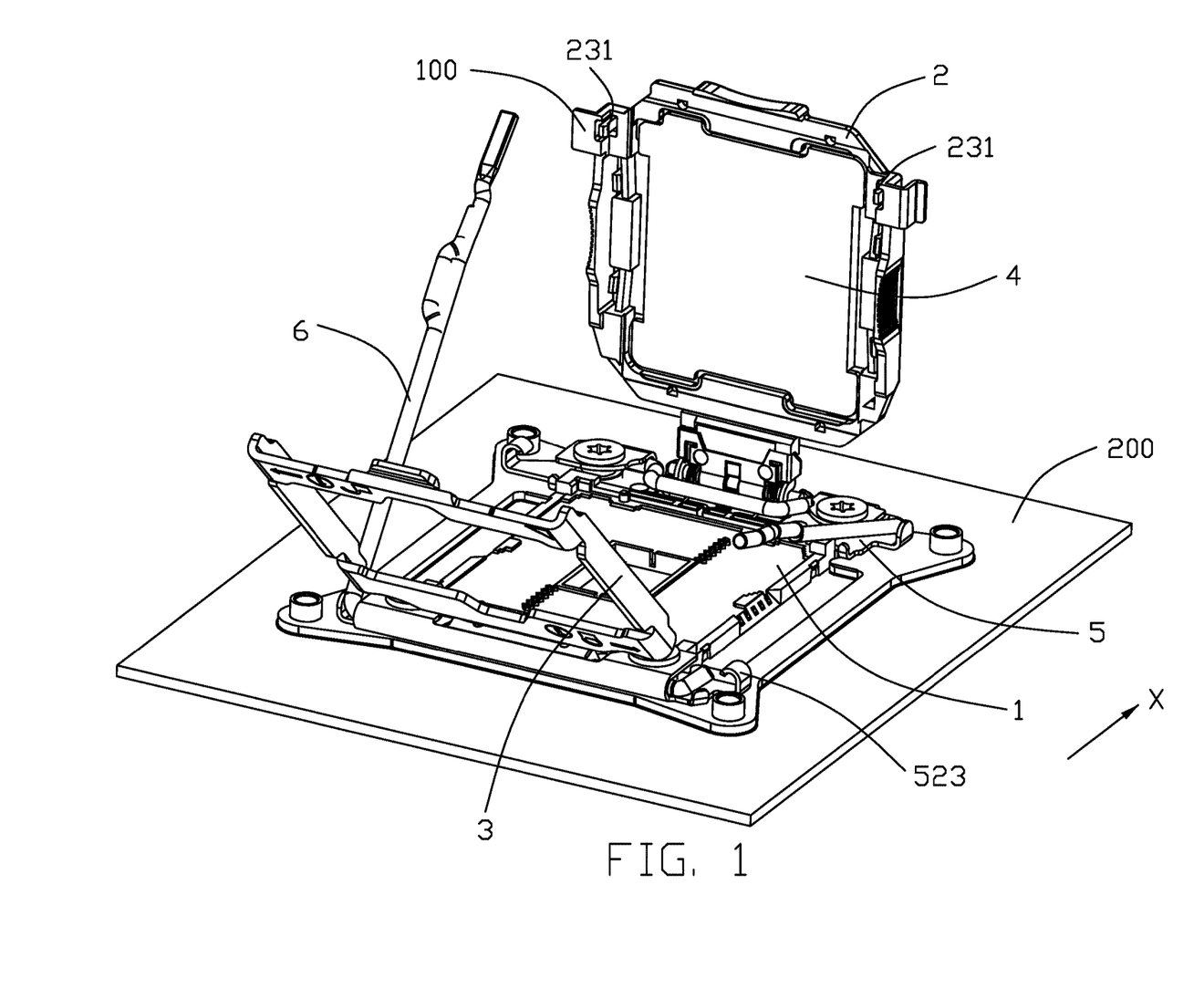
FIG. 1 is a perspective view of an electrical connector mounted upon a printed circuit board with a carrier and the load plate in an open status according to the invention.
Figure 2:
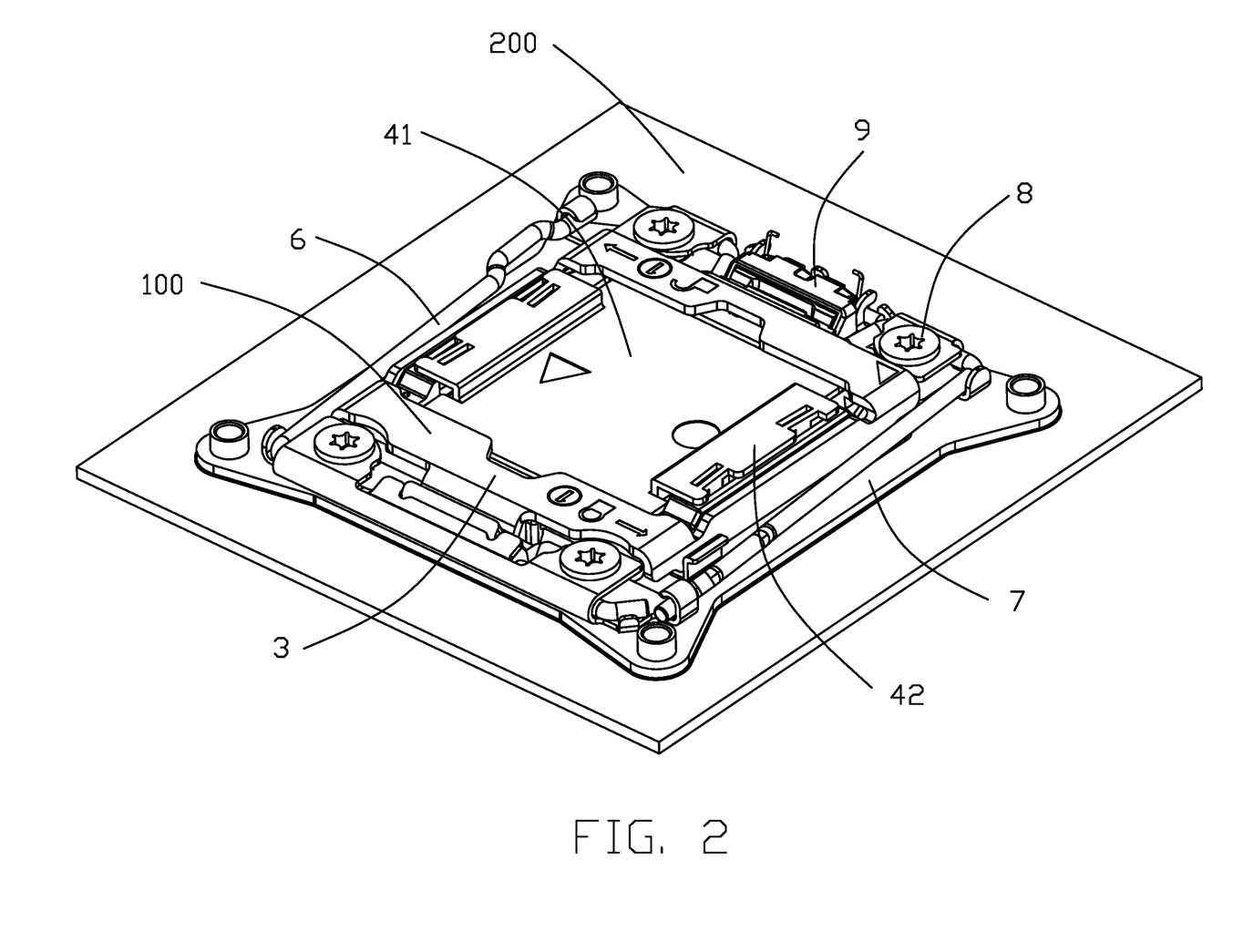
FIG. 2 is a perspective view of the electrical connector mounted on the printed circuit board of FIG. 1 with the carrier and the load plate in closed status.
Figure 3:
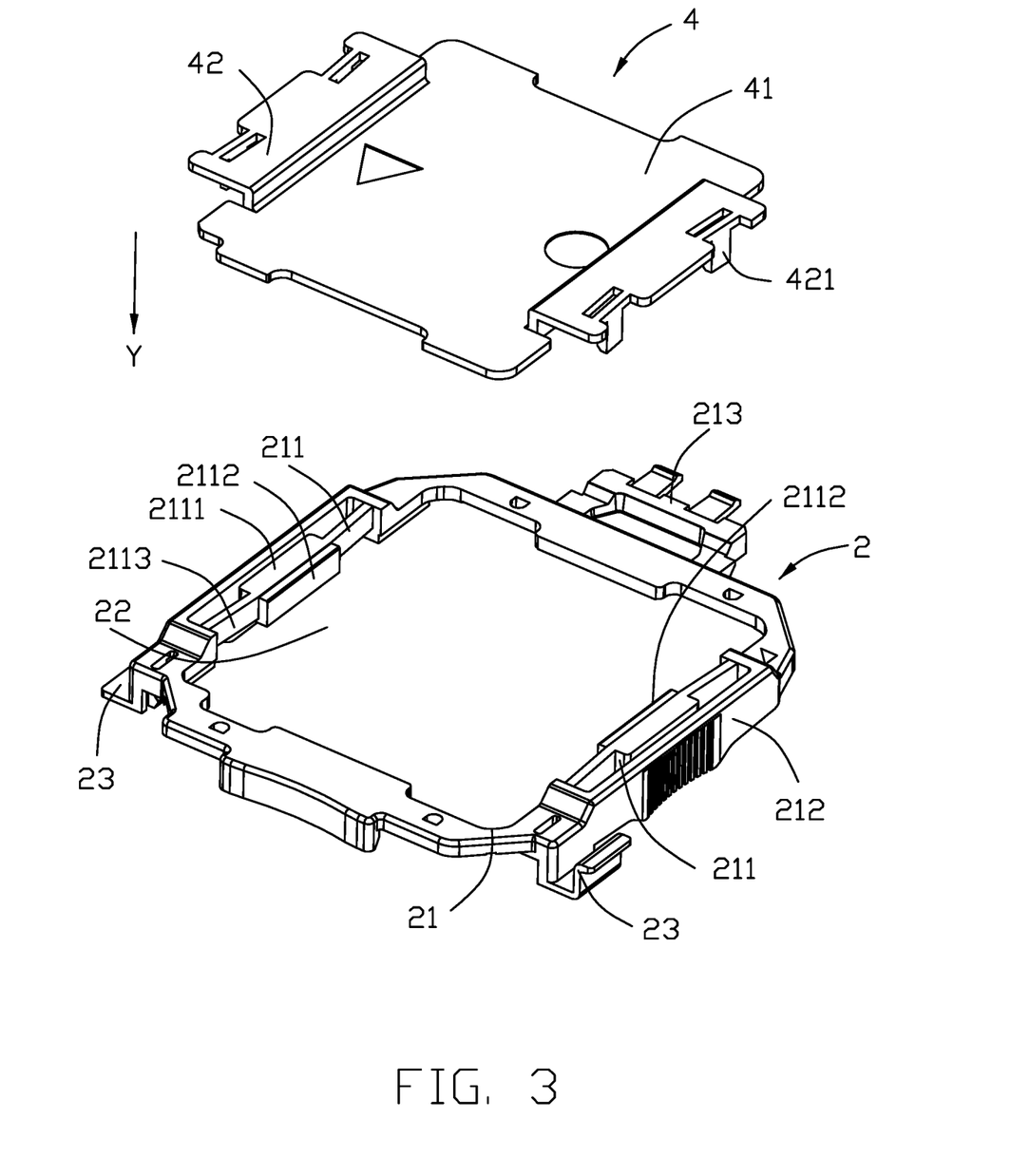
FIG. 3 is a downward exploded view of the carrier and the dust cover of the electrical connector of FIG. 1.
Figure 4:
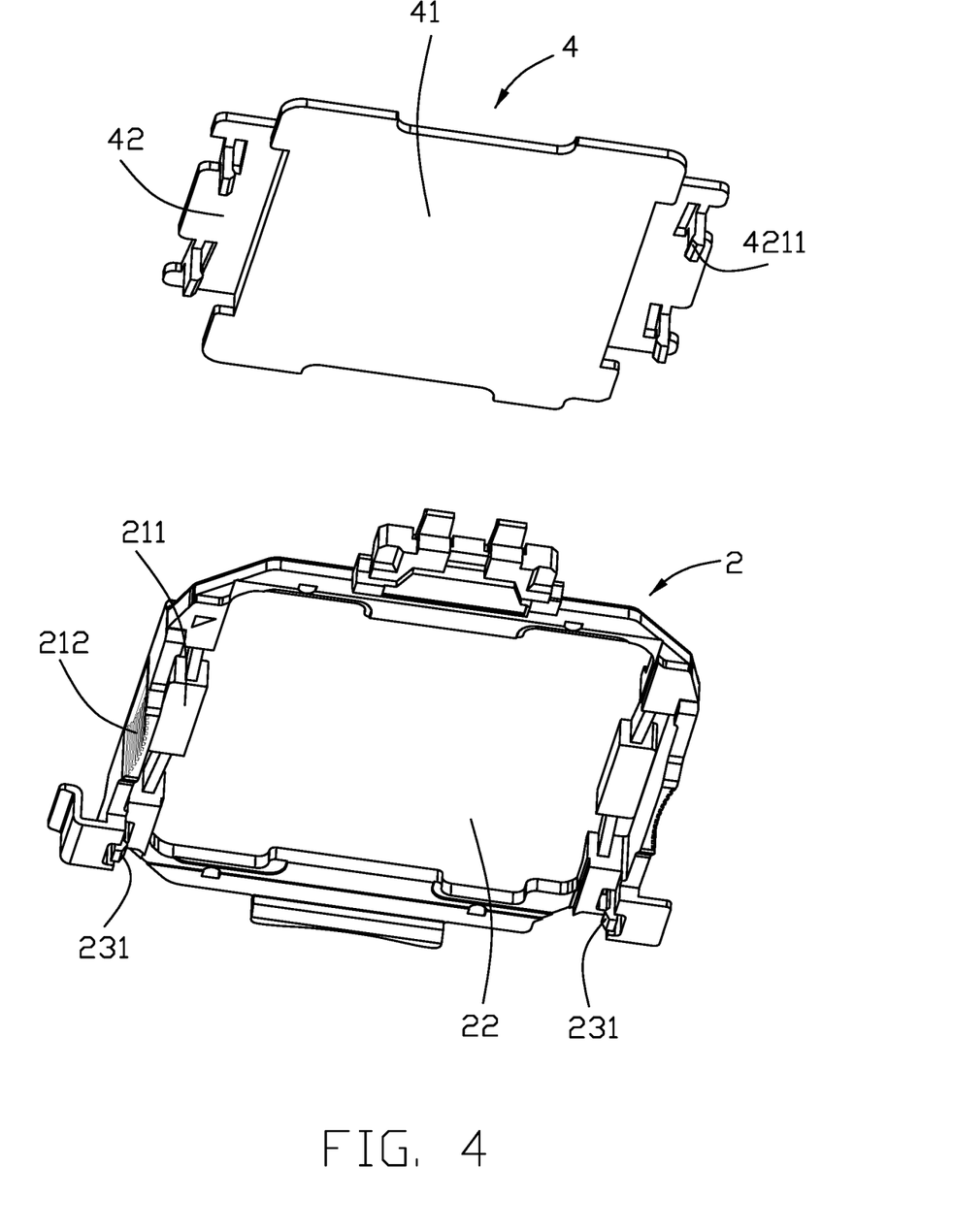
FIG. 4 is an upward exploded perspective view of the carrier and the dust cover of the electrical connector of FIG. 3.
Figure 5:
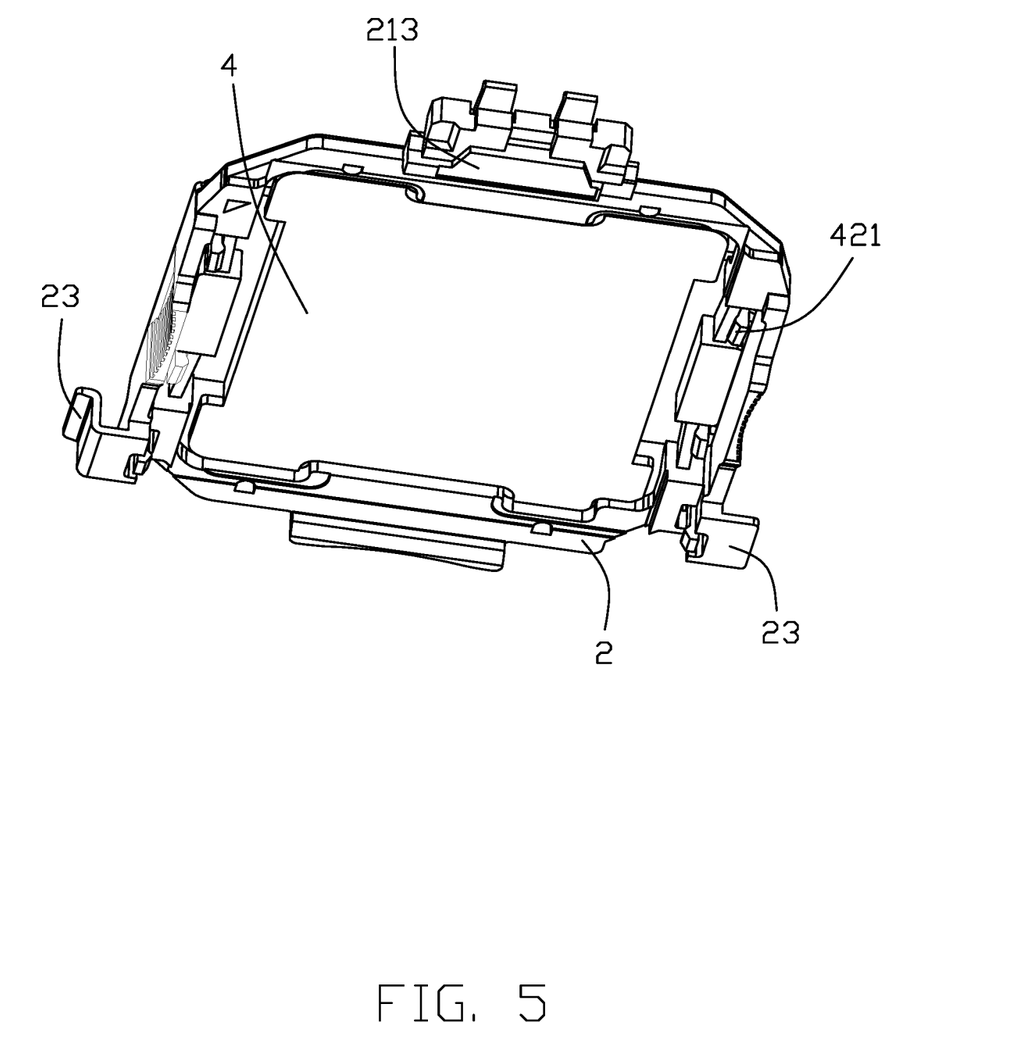
FIG. 5 is an upward assembled perspective view of the carrier and the dust-cover of the electrical connector of FIG. 1.
Figure 6:
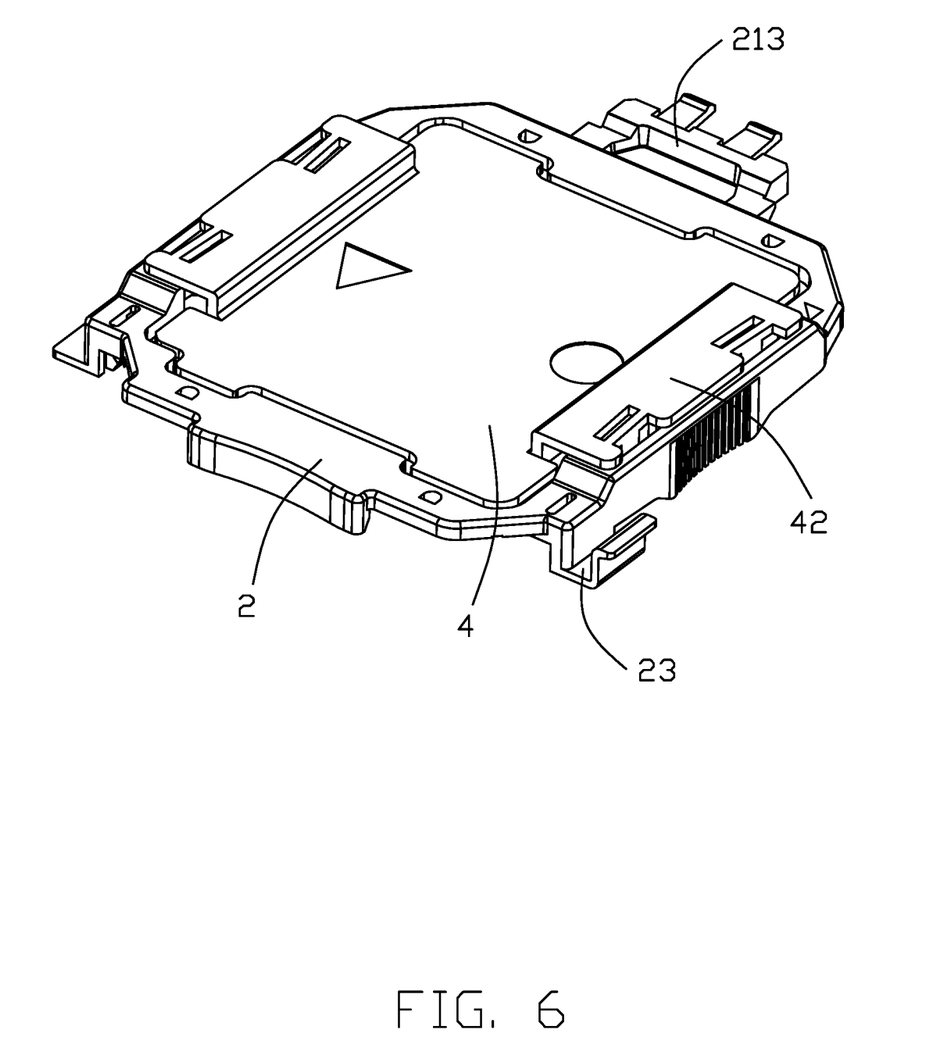
FIG. 6 is a downward assembled perspective view of the carrier and the dust-cover of the electrical connector of FIG. 5.
Figure 7:
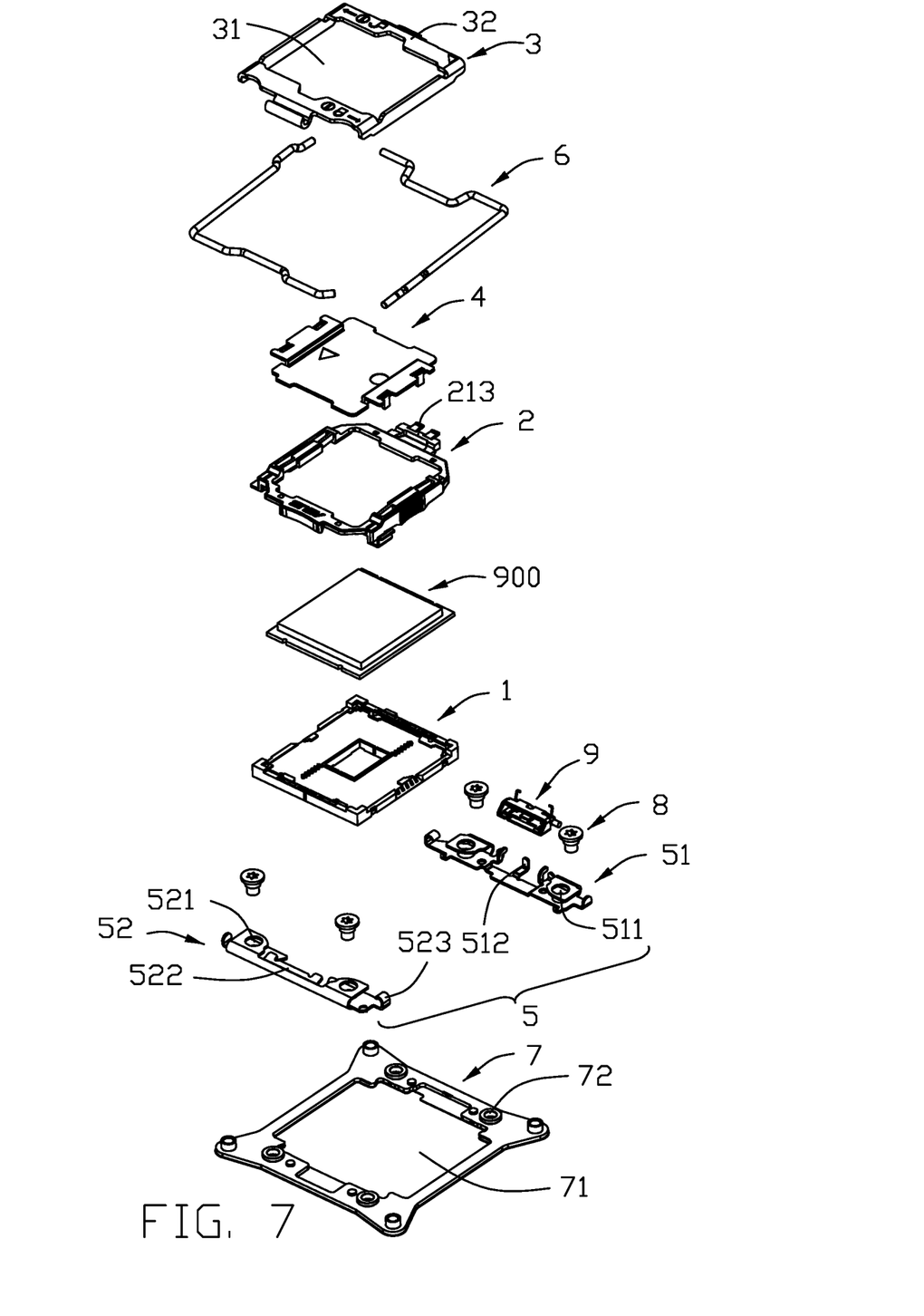
FIG. 7 is an exploded perspective view of the electrical connector of FIG. 1.
Figure 8:
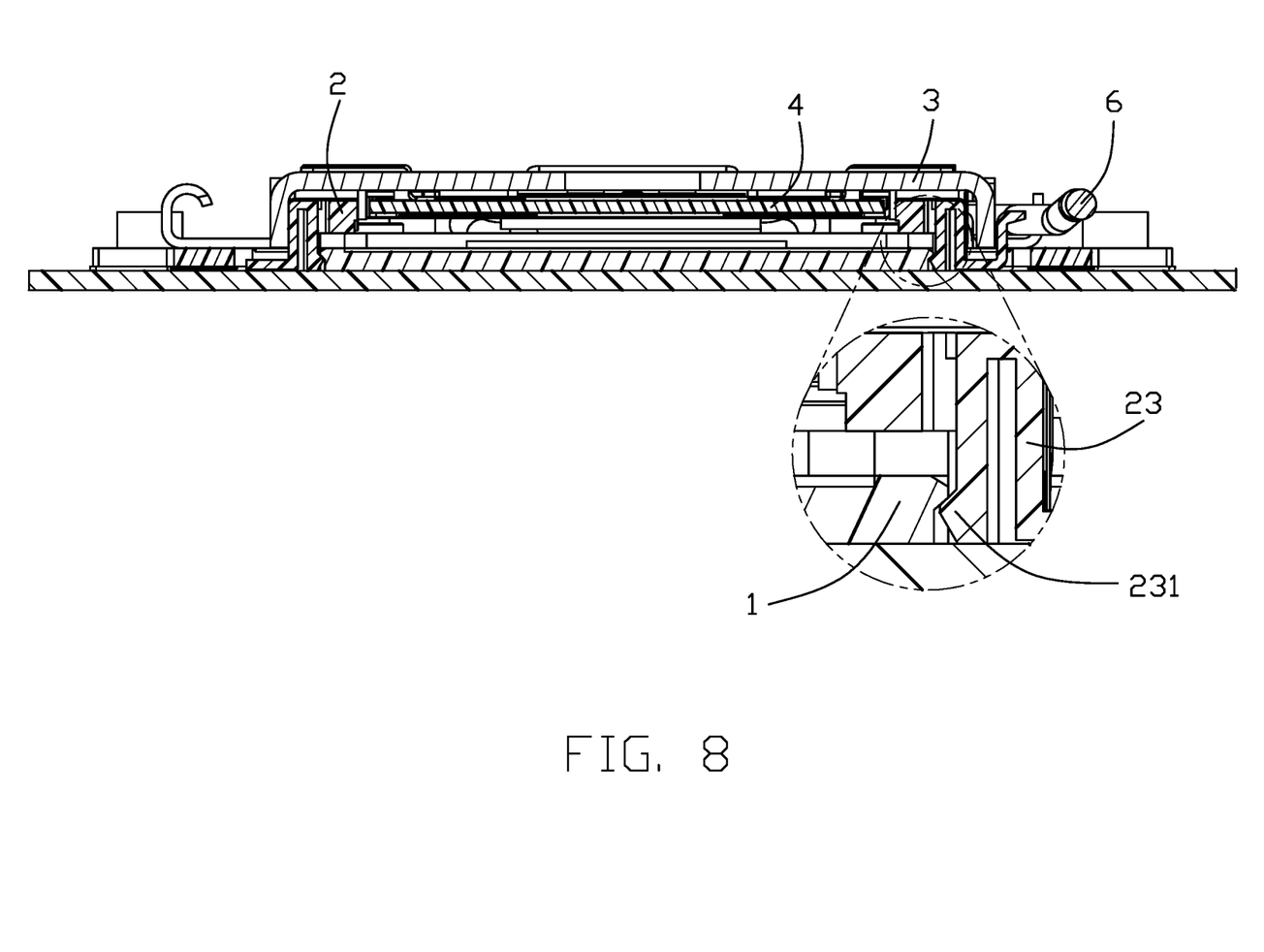
FIG. 8 is a cross-sectional view of the electrical connector of FIG. 1.

Referring to FIGS. 1-8, an electrical connector 100 for connecting an electronic package 900 (FIG. 7) to a printed circuit board 200, includes an insulative housing 1 with a plurality of conductive contacts (only few shown and not labeled) retained therein, an insulative carrier 2 for carrying and loading the electronic package 900 unto the housing 1, an insulative dust cover 4 detachably attached upon the carrier 2 in a direction Y perpendicular to the main plane (not labeled) of the carrier 2, and a metal fixing seat 5 located beside the housing 1, a set of metal levers 6 pivotally mounted upon the fixing seat 5, and a metallic load plate or pressing member 3 pivotally mounted to one of the levers 6, i.e., the left one in FIG. 7, and adapted to press downward the carrier 2 for retaining the carrier upon the housing 1. A locking tab (not labeled) at the free end of the load plate 3 is downwardly pressed by the other of the set of levers 6, i.e., the right one in FIG. 7. Notably, because the dust cover 4 is associated with the carrier 2 during shipping, thus performing the dust prevention effect during shipping advantageously.

The carrier 2 includes a pivotal section 213 positioned by one side, i.e., one end along a front-to-back direction X, of the housing 1 so as to be pivotal, with the associated dust cover 4, relative to the housing 1. The carrier 2 includes a peripheral wall 21 and the receiving cavity 22 therein. The load plate 3 forms an opening 31 in alignment with the receiving cavity 22 in the vertical direction. The carrier 2 has two opposite deflectable ears 23 on of which is of an L-shaped configuration while the other is of a U-shaped configuration. Each ear 23 is equipped with a hook 231 for retaining carrier 2 to the housing 1. The receiving cavity 22 extends through opposite top and bottom surfaces of the carrier 2. A pair of resilient bar 211 functioning as the engagement section of the carrier 2, are located behind the pair of grasping regions 212 which are respectively located on two lateral sides of the peripheral wall 21 so as to be by two sides of the pivotal section 213 when viewed in the front-to-back direction X.

The dust cover 4 includes a covering plate 41 covering the receiving cavity 22, and a pair of abutment sections 42 seated upon the grasping regions 212 in the vertical direction with corresponding structures extending therefrom to function as an engagement section of the dust cover 4 for engagement with the aforementioned engagement section of the carrier. The load plate 3 forms an opening 31 with a pair of bars (not labeled) by two sides of the opening 31 for restricting upward movement of the ears 23, and a pair of pressing sections 32 for downward abutment with the side regions of the covering plate 41 of the dust cover. In this embodiment, the dust cover 4 is transparent for easy inspection of the receiving cavity 22. The abutment section 42 includes a downwardly extending locking arm 421 with a hook 4211 at the end for engagement with the corresponding resilient bar 211. The resilient bar 211 is equipped with an inner block 2111 located in the space between the resilient bar 211 and the grasping region 212, an outer block 2112 for directly and intimately retainable abutment with the electronic package 900 in the transverse direction, and the engagement bar 2113 to which the hook 4211 of the locking arm 421 of the dust cover 4 is engaged.

The electrical connector 100 further includes a fixing piece 7 fixed upon the printed circuit board 200, a plurality of rivets 8 securing the fixing seat 5 upon the fixing piece 7, and a pivotal/rotatable seat 9 to which the pivotal section 213 of the carrier 2 is secured. The fixing piece 7 includes an opening 71 to receive the housing 1, and a plurality of fixing holes 72 to receive the corresponding rivets 8. The fixing seat 5 includes a first seat 51 for securing the pivotal seat 9 and the corresponding lever 6 in position, and a second seat 52 for securing the load plate 3 via the corresponding lever 6. The first seat 51 has a plurality of holes 511 through which the rivets extend, and securing tags 512 to which the pivotal seat 9 is secured. The second seat 52 includes holes 521 through which the corresponding rivets 8 extend, a securing tab 522 so as to restrain the corresponding lever 6 attached thereto, and a locking tab 523 for locking the lever 6 which is pivotally mounted upon first seat 51. Notably, the first seat 51 also includes a locking tab (not labeled) for locking the lever 6 pivotally mounted upon the second seat 52.

In operation, the dust cover 4 is attached to the carrier 2 via engagement between the engagement bar 2113 and the hook 4211. The carrier 2 and the dust cover 4 associated therewith, are commonly mounted to the pivotal seat 9. The carrier 2 with the associated dust 4 are commonly rotated to the horizontal position so as to have the hook 231 engaged with the housing 1. The load plate 3 is rotated, about the corresponding lever 6, to the horizontal position and further locked to the horizontal position by another corresponding lever 6. In this embodiment, the dust cover 4 is downwardly pressed by the pressing sections 32 of the load plate 3 so as to assure no inadvertent withdrawal from the electrical connector 100 due to an external impact during shipping. In other shipping situation when the housing 1 is not mounted upon the printed circuit board 200, the carrier 2 which is locked to the housing by the hook 231, is accompanied with the dust cover 4 which covers the receiving cavity 22, thus also assure the proper dust prevention effect. Understandably, in the present embodiment shown in FIGS. 1-8, the dust cover 4 is required to be first manually removed from the carrier 2 by disengaging the hook 4211 from the engagement bar 2113 before loading the electronic package unto the housing 1. Notably, in other embodiment with some special arrangement by removing downward abutment between the pressing section 32 and the dust cover 4, the disengagement between the engagement bar 2113 and the hook 4211 may automatically occur, when the electronic package is directly loaded unto the housing 1 and the carrier 2 with the dust cover 4 is pivotally downwardly moved to the horizontal position and further pressed by the load plate 3, due to upward abutment against the undersurface of the covering plate 41 derived from the electronic package which has been loaded into the receiving cavity 22 of the housing 1. Alternately, the electronic package and the dust cover 4 may not interfere with each other but simultaneously attached to the carrier 2 in some special situation.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the members in which the appended claims are expressed.

What is claimed is:

1. An electrical connector comprising:
   an insulative housing forming a receiving cavity for receiving an electronic package, and defining opposite ends in a front-to-back direction;
   a plurality of contacts retained in the housing;
   a carrier configured to directly and intimately retain said electronic package therein and pivotally located by one of said opposite ends of the housing;
   a dust cover detachably attached to the carrier with a covering plate to cover the receiving cavity when said dust cover is in a horizontal position; and
   a load plate pivotally located by the other of said opposite ends of the housing; wherein
   said load plate downwardly presses the carrier when both said load plate and said carrier are in corresponding horizontal positions.

2. The electrical connector as claimed in claim 1, wherein said load plate further downwardly presses the dust cover.

3. The electrical connector as claimed in claim 1, wherein said carrier is detachably engaged with the housing.

4. The electrical connector as claimed in claim 1, wherein the dust cover is detachably attached to the carrier in a direction perpendicular to a main plane of the carrier.

5. The electrical connector as claimed in claim 1, wherein said carrier is detachably attached to a pivotal seat around said end.

6. The electrical connector as claimed in claim 1, wherein said carrier forms a pair of resilient bars for retaining not only the electronic package but also the dust cover.

7. An electrical connector assembly comprising:
   an insulative housing defining a receiving cavity for receiving an electronic package therein;
   a plurality of contacts retained in the housing;
   a carrier detachably attached to the housing and configured to directly and intimately retain the electronic package thereto to have said electronic package in the receiving cavity; and a dust cover detachably attached to the carrier with a covering plate covering the receiving cavity when said carrier is attached to the housing; wherein said carrier forms a pair of resilient bars for retaining not only the electronic package but also the dust cover.

8. The electrical connector assembly as claimed in claim 7, wherein said dust cover includes hooks to engage the resilient bar.

9. The electrical connector assembly as claimed in claim 7, wherein said resilient bar includes retaining block for abutting against the electronic package transversely.

10. The electrical connector assembly as claimed in claim 7, wherein said pair of resilient bars are located on two transverse sides of the carrier.

11. The electrical connector assembly as claimed in claim 10, wherein said carrier is adapted to be pivotally moved relative the housing about a pivot extending along a transverse direction.

12. The electrical connector assembly as claimed in claim 11, wherein the dust cover is detachably attached to the carrier in a direction perpendicular to a main plane of the carrier.

13. The electrical connector assembly as claimed in claim 12, further including a load plate pivotal with regard to the housing opposite to the carrier and further including a printed circuit board on which the housing, and carrier and the load plate are mounted.

14. The electrical connector assembly as claimed in claim 13, wherein said housing is essentially directly mounted to the printed circuit board while said load plate and said carrier are mounted indirectly via corresponding pivotal seat and lever.

15. An electrical connector assembly comprising:
a printed circuit board;
an insulative housing mounted upon the printed circuit board and defining opposite ends in a front-to-back direction and therein a receiving cavity for receiving an electronic package;
a plurality of contacts retained in the housing;
a load plate pivotally mounted upon the printed circuit board around one of said ends;
a carrier moveable with regard to the housing and configured to detachably retain directly and intimately thereto not only said electronic package but also a dust cover having a covering plate covering the receiving cavity when both said carrier and the dust cover are in corresponding horizontal positions; wherein
said carrier is held in position by the load plate; wherein
said load plate includes pressing sections restricting upward movement of the dust cover.

16. The electrical connector assembly as claimed in claim 15, wherein said dust cover is required to be removed for not interfering with the electronic package.

17. The electrical connector as claimed in claim 15, wherein said carrier is pivotally mounted to the printed circuit board around the other end.

18. The electrical connector as claimed in claim 15, wherein the carrier includes means for engagement with the housing when said carrier is in the horizontal position.

* * * * *